(12) United States Patent
Sun et al.

(10) Patent No.: US 11,765,867 B2
(45) Date of Patent: Sep. 19, 2023

(54) COOLING SYSTEM FOR DATA CENTER BASED ON HYPERBOLA COOLING TOWER

(71) Applicant: Beijing Huahui Nenghai Technology Co., Ltd., Beijing (CN)

(72) Inventors: Xiaogang Sun, Beijing (CN); Lu Wei, Beijing (CN)

(73) Assignee: Beijing Huahui Nenghai Technology Co., Ltd., Beijing (CN)

( * ) Notice: Subject to any disclaimer, the term of this patent is extended or adjusted under 35 U.S.C. 154(b) by 0 days.

(21) Appl. No.: 17/989,746

(22) Filed: Nov. 18, 2022

(65) Prior Publication Data
US 2023/0171930 A1 Jun. 1, 2023

(30) Foreign Application Priority Data

Nov. 29, 2021 (CN) .......................... 202111436769.4

(51) Int. Cl.
*H05K 7/20* (2006.01)

(52) U.S. Cl.
CPC ..... *H05K 7/20827* (2013.01); *H05K 7/20309* (2013.01); *H05K 7/20318* (2013.01); *H05K 7/20327* (2013.01); *H05K 7/20354* (2013.01); *H05K 7/20381* (2013.01); *H05K 7/20836* (2013.01)

(58) Field of Classification Search
CPC ........... H05K 7/20827; H05K 7/20309; H05K 7/20318; H05K 7/20327; H05K 7/20354; H05K 7/20381; H05K 7/20836
See application file for complete search history.

(56) References Cited

FOREIGN PATENT DOCUMENTS

| CN | 212720085 U | * | 3/2021 |
| CN | 113446710 A | * | 9/2021 |

* cited by examiner

*Primary Examiner* — Ana M Vazquez
(74) *Attorney, Agent, or Firm* — COOPER LEGAL GROUP, LLC

(57) ABSTRACT

The embodiments of the present application provide a cooling system for data center based on a hyperbola cooling tower. The cooling system includes a compressor, a condenser, a primary fluorine pump, a secondary fluorine pump, a throttling apparatus, an evaporator, and a server. The server is configured to receive data information uploaded from the compressor, the condenser, the primary fluorine pump, the secondary fluorine pump, the throttling apparatus, and the evaporator, calculates the operation frequency of the compressor based on the data information, and control the condenser, the primary fluorine pump, the secondary fluorine pump and the throttling apparatus to transport the refrigerant to the evaporator.

9 Claims, 3 Drawing Sheets

COOLING SYSTEM FOR DATA CENTER BASED ON HYPERBOLA COOLING TOWER

CROSS-REFERENCE TO RELATED APPLICATION

This application claims the priority and benefit of Chinese patent application serial no. 202111436769.4, filed on Nov. 29, 2021. The entirety of the above-mentioned patent application is hereby incorporated by reference herein and made a part of this specification.

TECHNICAL FIELD

The present application relates to a field of industrial cooling and in particular, relates to a cooling system for data center based on a hyperbola cooling tower.

BACKGROUND ART

According to the statistics, the power consumption of the data center is rapidly increased from 2011-2016, with a rapid growth rate of more than 10% every year. In 2017, the total power consumption of the data center in China reaches 130 billion kWh, while the annual power generation of the Three Gorges Dam is 97.605 billion kWh in that year. In 2018, the total power consumption of the data center in China reaches 150 billion kWh, which is up to 2% of the total social electricity consumption in China. The proportion is estimated to double to 4.05% by 2025.

The large data center may adopt the traditional water-side free natural cooling as the cooling system framework. This system is configured with devices, such as a cooling-water machine, a plate exchanger, a cooling tower, a water pump, a cold storage tank and so on. In summer, the cooling-water machine provides the data center with a cooling source in a mechanical refrigeration manner. In winter, the cooling tower and the plate exchanger provide the data center with the cooling source in a water-side free natural cooling manner. In transition seasons, the cooling-water machine, the cooling tower and the heat exchanger operate jointly and provide the data center with the cooling source. A calculation is conducted according to the traditional water-side natural cooling refrigeration system with high water temperature. PUEs (Power Usage Effectiveness) of the ultra large data centers established in Beijing, Shenzhen, and Chengdu are 1.25, 1.30, 1.35 and 1.30 respectively, which meets the "Guidance on Strengthening the Construction of Green Data Center" issued by the Ministry of Industry and Information Technology of China. However, since the water-side natural cooling system with high water temperature is already adopted, the energy efficiency has a limited improvement space, so that it is hard to meet the requirements of PUE limiting value of 1.15 or 1.25 in Beijing.

Based on the above situation, it is necessary to promote a new solution of the refrigeration system to improve the energy efficiency of the data centers and to meet the requirements of the current situation, which complies with future development tendency.

SUMMARY

According to the embodiments in the present application, a cooling solution for data center based on a hyperbola cooling tower is provided.

In a first aspect of the present application, a cooling system for data center based on a hyperbola cooling tower is provided.

The cooling system includes a compressor, a condenser, a primary fluorine pump, a secondary fluorine pump, a throttling apparatus, an evaporator, and a server.

The server is configured to receive data information uploaded from the compressor, the condenser, the primary fluorine pump, the secondary fluorine pump, the throttling apparatus, and the evaporator, calculate an operation frequency of the compressor based on the data information, and transport a refrigerant to the evaporator via the condenser, the primary fluorine pump, the secondary fluorine pump and the throttling apparatus.

The condenser is configured to cool the refrigerant transported from the compressor and transport the refrigerant to the primary fluorine pump.

The primary fluorine pump is configured to receive the refrigerant transported from the condenser and transport the refrigerant to the secondary fluorine pump.

The secondary fluorine pump is configured to receive the refrigerant transported from the primary fluorine pump and transport the refrigerant to the evaporator via the throttling apparatus.

The evaporator is configured to release the refrigerant.

Further, the server is further configured to:

generate an operation curve of the device based on the data information; and determine the operation frequency of the compressor base on the operation curve and a refrigerant transportation amount required for each area of the data center.

Further, the server is further configured to:

determine a total refrigerant transportation amount based on the refrigerant transportation amount required for each area of the data center;

determine a time required for refrigerating in each area based on the operation curve; and determine the operation frequency of the compressor based on the total refrigerant transportation amount and the time required for refrigerating in each area.

Further, the cooling system includes a sensor as well.

The server is configured to acquire a system temperature, a system flow rate, an outdoor temperature, an outdoor humidity, and temperatures and humidity of each area of the data center through the sensor; and in which the server is further configured to determine the refrigerant transportation amount required for each area of the data center based on the system temperature, the system flow rate, the outdoor temperature, the outdoor humidity, and temperatures and humidity of each area of the data center.

Further, each area of the data center includes one or more cooling areas. The system further includes an area temperature monitoring module, which is configured to: acquire a temperature value in each of the one or more cooling areas, and upload the temperature value to the server.

The server is further configured to receive the temperature value and adjust a refrigerant amount transported to the one or more cooling areas based on the temperature value.

Further, the server is configured to:

adjust the refrigerant amount transported to the one or more cooling areas based on a predetermined PID logic.

Further, a compressor monitoring module is further included, which is configured to: monitor an operation state of the compressor, and upload a monitoring data to the server.

The server is further configured to receive the monitoring data and adjust a frequency, a flow rate, and an evaporation temperature and/or a condensation temperature of the compressor based on the monitoring data.

Further, the server is further configured to:
monitor an inlet pressure, an outlet pressure and an inlet flow rate of the compressor.

Further, the secondary fluorine pump is configured to transport refrigerant to one or more evaporators, and the primary fluorine pump is configured to transport refrigerant to one or more secondary fluorine pumps.

Further, an outdoor environment temperature monitoring module is further included, which is configured to:
acquire environment temperatures around the each area of the data center, and upload the environment temperatures to the server.
The server is further configured to receive the environment temperature around the each area of the data center, and if any one of the environment temperatures is lower than a threshold value, stop the refrigerant transportation to a corresponding area.

The cooling system for data center based on a hyperbola cooling tower provided in the present application acquires the operation data, generates the corresponding device operation curve, determines the operation frequency of the compressor based on the operation curve and the refrigerant transportation amount required for each area of the data center, and transports the refrigerant to each area of the data center based on the operation frequency of the compressor, which extremely reduces the energy consumption of the data center.

It should be understood that, the content described in the summary is not intended to limit the key or important technical features of the embodiments of the present application, and also not intended to limit the protection scope of the present application. The other technical features of the present application can be understood easily by the description below.

BRIEF DESCRIPTION OF THE DRAWINGS

In combination with the figures and in reference to the detail description below, the above mentioned and other technical solutions, advantages and aspects of the embodiments in the present application become clearer. In the figures, the same or the similar reference sign indicates the same or the similar element, wherein.

DETAILED DESCRIPTION

In order to make the object, the technical solution and the advantages of the embodiments in this disclosure clearer, the technical solution of the embodiment in this disclosure is described clearly and completely below in combination with the figures of the embodiments in this disclosure. It is obvious that the described embodiments are one part of the embodiments of this disclosure, but doesn't cover all embodiments. Based on the embodiments in this disclosure, all the other embodiments without creative effort obtained by those skilled in the art falls within the protection scope of the disclosure.

In addition, a term "and/or" in the present application is only an association relationship describing association objects, in which three relationships could be provided. For example, "A and/or B" could represent three situations: A exists alone, A and B exist simultaneously, and B exists alone. In addition, a character of "/" in the disclosure is generally represented that the association objects have a "or" relationship.

Figure 1:
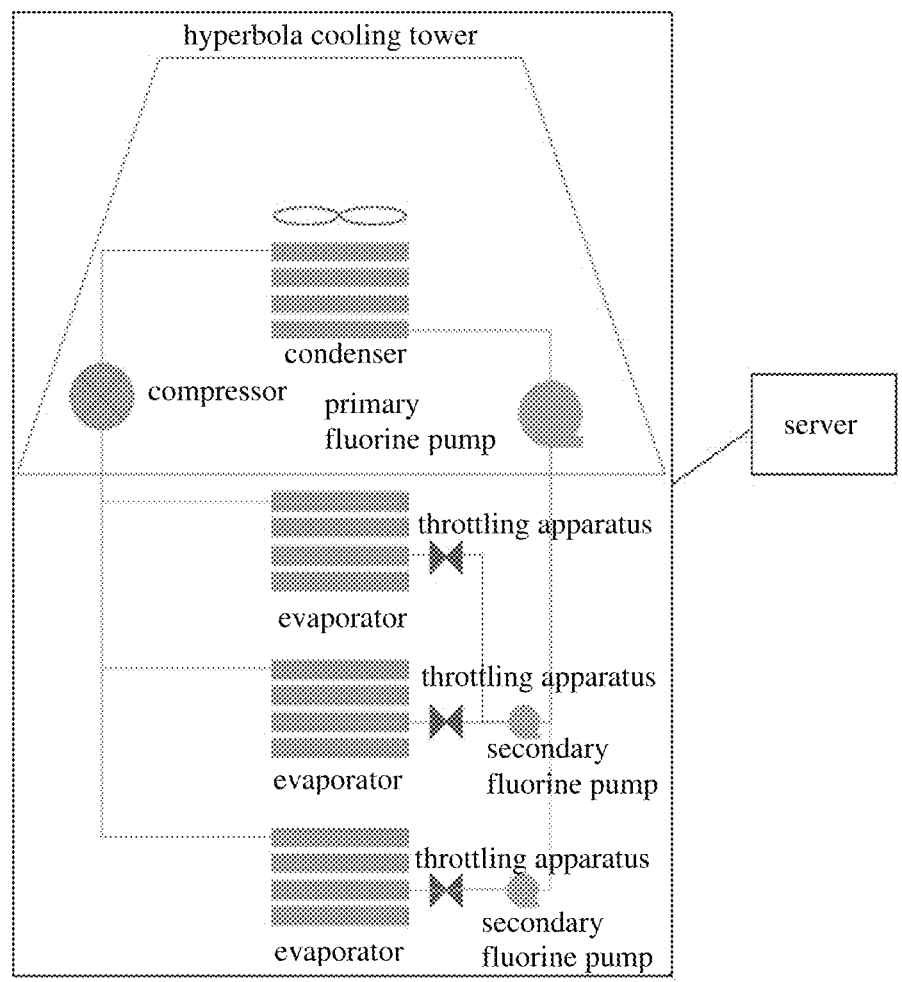
FIG. 1 illustrates a framework diagram of a cooling system for data center based on a hyperbola cooling tower according to an embodiment in the present application.

FIG. 1 illustrates a framework diagram of a cooling system for data center based on a hyperbola cooling tower according to an embodiment in the present application. The cooling system for data center based on hyperbola cooling tower includes a compressor, a condenser, a primary fluorine pump, a secondary fluorine pump, a throttling apparatus, an evaporator, and a server (a center control system), in which the compressor is configured to transport a refrigerant to the condenser in a hyperbola cooling tower.

The condenser is configured to cool the refrigerant transported from the compressor and transport the refrigerant to the primary fluorine pump. An interior of a data center could be divided into a plurality of small subareas according to the areas, and the subareas could be opened and closed independently.

The primary fluorine pump is configured to receive the refrigerant transported from the condenser and transport the refrigerant to the secondary fluorine pump.

The secondary fluorine pump is configured to receive the refrigerant transported from the primary fluorine pump and transport the refrigerant to the evaporator through the throttling apparatus.

The evaporator is configured to release the refrigerant. Generally, each cooling area is provided with one evaporator, and each area (each subarea) of the data center could include one or more cooling areas.

The throttling apparatus is configured to adjust an opening aperture of the throttling apparatus according to a predetermined PID logic, so as to influence a flow rate of the refrigerant in the evaporator.

The server is connected to the above devices including the compressor, the condenser, the primary fluorine pump, the secondary fluorine pump, the throttling apparatus and the evaporator in a wire or wireless manner, and the server is configured to receive the data information uploaded from the compressor, the condenser, the primary fluorine pump, the secondary fluorine pump, the throttling apparatus, and the evaporator, such as the temperature information uploaded by a temperature sensor arranged at an inlet of the evaporator, and an inlet pressure, an outlet pressure and a flow rate of the compressor uploaded by sensors arranged on the compressor. An operation frequency of the compressor is calculated based on the data information. And the condenser, the primary fluorine pump, the secondary fluorine pump and the throttling apparatus are configured to transport the refrigerant to the evaporator.

In some embodiments, the sensors in the disclosure include an outdoor temperature sensor, an outdoor relative humidity sensor, an outdoor wind speed sensor, a compressor inlet pressure sensor, a compressor outlet pressure sensor, a compressor inlet temperature sensor, a compressor outlet temperature sensor, a compressor inlet flow rate sensor, a condenser inlet pressure sensor, a condenser outlet pressure sensor, a condenser inlet temperature sensor, a condenser outlet temperature sensor, a condenser inlet flow rate sensor, a fluorine pump inlet pressure sensor, a fluorine pump outlet pressure sensor, a fluorine pump inlet temperature sensor, a fluorine pump outlet temperature sensor, a fluorine pump inlet flow rate sensor, an evaporator inlet pressure sensor, an evaporator outlet pressure sensor, an evaporator inlet temperature sensor, an evaporator outlet temperature sensor, and/or an evaporator inlet flow rate sensor.

In the disclosure, the primary fluorine pump is configured to transport refrigerant to one or more secondary fluorine pumps, and the secondary fluorine pump is configured to transport refrigerant to one or more evaporators. Specifically, an outlet port of the primary fluorine pump is directly or indirectly communicated with an inlet port of one secondary fluorine pump or inlet ports of a plurality of secondary fluorine pumps. An outlet port of the secondary fluorine pump is directly or indirectly communicated with an inlet port of one evaporator or inlet ports of a plurality of secondary fluorine pumps.

Figure 2:
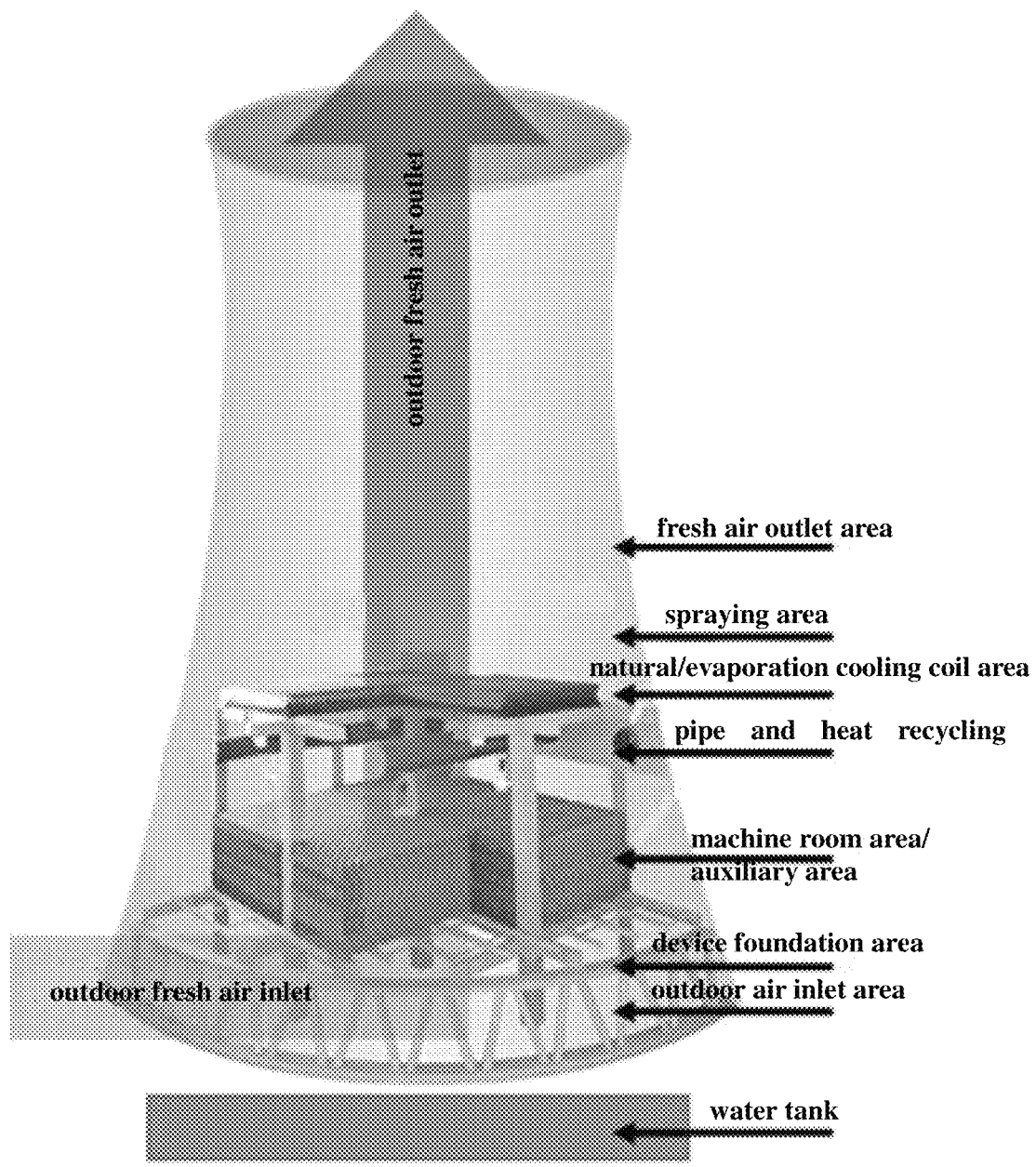
FIG. 2 illustrates an interior structural schematic diagram of a hyperbola cooling tower according to an embodiment in the present application.

Referring to FIG. 2, the disclosure is used in a hyperbola cooling tower. FIG. 2 illustrates an interior structural schematic diagram of a hyperbola cooling tower according to an embodiment in the present application.

It should be noted that, the hyperbola cooling tower data center structure in the disclosure adopts a conventional hyperbola cooling tower structure reserved with an outdoor fresh air inlet channel, an outdoor fresh air outlet channel and a bottom water tank. A device foundation is arranged above an outdoor fresh air inlet area. Essential function areas of the data center, such as a machine room area/an auxiliary area, a pipe and heat recycling system area, a natural cooling coil area/an evaporation cooling coil area, and a spraying area, are arranged on the device foundation successively.

Figure 3:
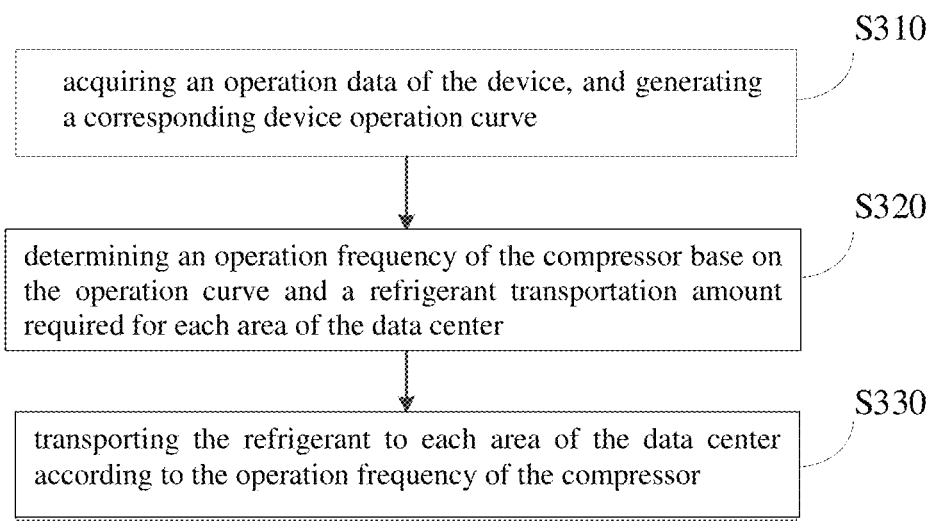
FIG. 3 illustrates a flow chat diagram of a method for implementing a cooling system for data center based on a hyperbola cooling tower according to an embodiment in the present application.

FIG. 3 illustrates a flow chat diagram of a method for implementing a cooling system for data center based on hyperbola cooling tower according to an embodiment in the present application. The method includes step S310: acquiring an operation data of the device, and generating a corresponding device operation curve.

Specifically, the device includes the compressor, the condenser, the primary fluorine pump, the secondary fluorine pump, the throttling apparatus, and the evaporator of the cooling system for data center based on a hyperbola cooling tower. When in an initial operation stage after the system starting, the compressor, the primary fluorine pump, the secondary fluorine pump may be preferred to be operated under a relatively large working conditions, ensuring that the system cycles in a short time and ensuring enough flow rate of each component. A slow, multi-level and distributed adjustment is gradually conducted according to a comparison between a predetermined value and an actual value and an actual situation of each component, gradually meeting the system requirements, so that the system is in a relatively stable operation state.

In some embodiments, after the system operates normally, the operation state of each device is acquired through sensors arranged on each device. That is, the operation curve of each device is generated based on the data information uploaded by each device. Historical operation curves of each device are stored in the server. Based on the historical operation curves, a correction of the generated operation curve according to factors such as power consumption structure change (caused by changes in an industrial structure, a technological progress, and an improvement of living standards), temperature, and demand side management.

Step 320: determining an operation frequency of the compressor base on the operation curve and a refrigerant transportation amount required for each area of the data center.

In some embodiments, the refrigerant transportation amount is determined based on the refrigerant transportation amount required for each area of the data center. The refrigerant transportation amount required for each area of the data center could be determined based on the temperature in the area, the environment temperature around the area and the space size of the area.

A time required for refrigerating in each area is determined based on the operation curve.

The operation frequency of the compressor is determined according to the total refrigerant transportation amount and the time required for refrigerating in each area.

Step S330: transporting the refrigerant to each area of the data center based on the operation frequency of the compressor.

In some embodiments, after determining the operation frequency of the compressor, the refrigerant is transported to the condenser inside the hyperbola cooling tower. After the condenser is cooled, the refrigerant flows via the primary fluorine pump. The primary fluorine pump is configured to transport the refrigerant to the pipe close to the evaporator. The secondary fluorine pump near the evaporator or evaporator group is configured to transport the refrigerant to each evaporator. The throttling apparatus before the evaporator is configured to adjust the refrigerant amount required for the area and room where the evaporator is arranged, allowing the refrigerant to be fully released in the evaporator, and ensuring that the refrigerant has enough power to return to the compressor.

Further, during operation of the system, in order to ensure the operation efficiency, it is required to monitor the operation efficiency of each device.

Specifically, during the whole refrigerating-cooling cycle of the system, the temperature values uploaded by the temperature sensors arranged at the inlet port or outlet port of the evaporator (the sensors are arranged according to the actual application scenario) are acquired in a real time. The temperature value is compared with the predetermined threshold for determining whether the refrigerating effect in the current area meets the refrigerating requirements. A signal is transmitted to the throttling apparatus. The throttling apparatus is configured to adjust the opening aperture of the throttling apparatus based on the predetermined PID logic, so as to influence the flow rate of the refrigerant in the evaporator. For example, when it is not satisfied with the requirements, the opening aperture is increase. On the contrary, the opening aperture of the throttling apparatus is reduced or closed. At this time, the server is configured to record the regulation data and the related records of all evaporators, throttling apparatuses and the secondary fluorine pumps.

In some embodiments, the server is further configured to adjust the operation frequency of the compressor according to the recorded data. The server is further configured to conduct a comprehensive judgment based on the compressor, the condenser, the outdoor temperature and the device capacity.

Specifically, when the actual refrigerating requirement of an evaporator is higher than the refrigerating capacity of the evaporator currently, that is, when the temperature of the evaporator inlet or the temperature of the evaporator outlet is higher than the set threshold, it is preferred to increase the opening aperture at this position. When it still doesn't work, the frequency of the secondary fluorine pump is increased. When it is still satisfied with the system demand, for example, only the temperature at the evaporation doesn't meet the demand, the frequency of the evaporator fan is adjusted, or a comprehensive judgement is conducted by the center control system (server). If it still doesn't meet the system demand after multistage adjustment a fault alarm information may be sent to the operator. The fault alarm information includes the location of the evaporation and the related data information such as refrigerating requirements, adjustment record and so on.

When the actual refrigerating requirement is smaller than the refrigerating capacity of the evaporator, an opposite adjustment could be conducted referring to the above adjusting method.

In some embodiments, when adjusting the evaporators, the throttling apparatuses, and the secondary fluorine pumps, the server is configured to acquire the data information and the operation data such as the inlet pressure, the outlet pressure and the inlet flow rate of the compressor. The server is further configured to determine whether the compressor operates in a best operation state based on the rated parameter (performance parameter) and the operation data after AI algorithm correction. The server is further configured to adjust the frequency of the compressor, the flow rate, the evaporation temperature, the condensing temperature to a relative lower energy consumption and detect whether the state of the compressor is near the surge risk area. If it is necessary (the compressor is near the surge risk area), a warm gas bypass of the compressor will be opened for a short time, and a fast operational analysis is conducted in this area to search for a best operation state satisfied with the refrigerating requirement and a fast adjustment is conducted.

The server is further configured to determine whether to increase or decrease the condenser opening area and the condensing temperature based on the outdoor environment temperature (acquired by outdoor environment temperature monitoring module), the opening area of the condenser (according to the divided subareas in each area of the data center) and the heat dissipation capacity.

Specifically, when the actual refrigerating requirement is larger than the refrigerating capacity of the evaporator and the outdoor temper is relatively low, it could be selected to close a portion of the condensing area or lower the condensing temperature. In addition, the closed or the condensing temperature lowered condensing area could conduct a natural heat dissipation to the outside, reaching the purpose of reducing the comprehensive operation consumption of the system. On the contrary, a opposite adjustment could be conducted. The server is further configured to conduct a comprehensive judgement based on the outdoor temperature, the compressor load, the primary fluorine pump load and the opening area of the condenser, and adjust the corresponding parameters to reach a best operation state of the system, realizing the object of a comprehensive energy saving of the system.

According to the embodiments in the present application, the following technical effects are realized.

The disclosure adopts a cooling system with the hyperbola cooling tower, the compressor and the fluorine pump assembly, which could effectively solve the problem of the hard adjustment and regulation of the large fluorine pump system. In addition, the function of the hyperbola cooling tower can reach the best, improving the working efficiency, reducing the economic cost and extremely reducing the energy consumption of the data center.

It should be noted that, the above embodiments adopt the description of the combination of a series of actions for a simple description. However, those skilled in the art should understand that the present application is not limited to the sequence of the described actions. According to the present application, some steps could be conducted in other sequences or conducted simultaneously. In addition, those skilled in the art should also understand that the described embodiments in the description all belong to the optional embodiments, the involved actions and the modules don't have to be included in the present application.

Figure 4:
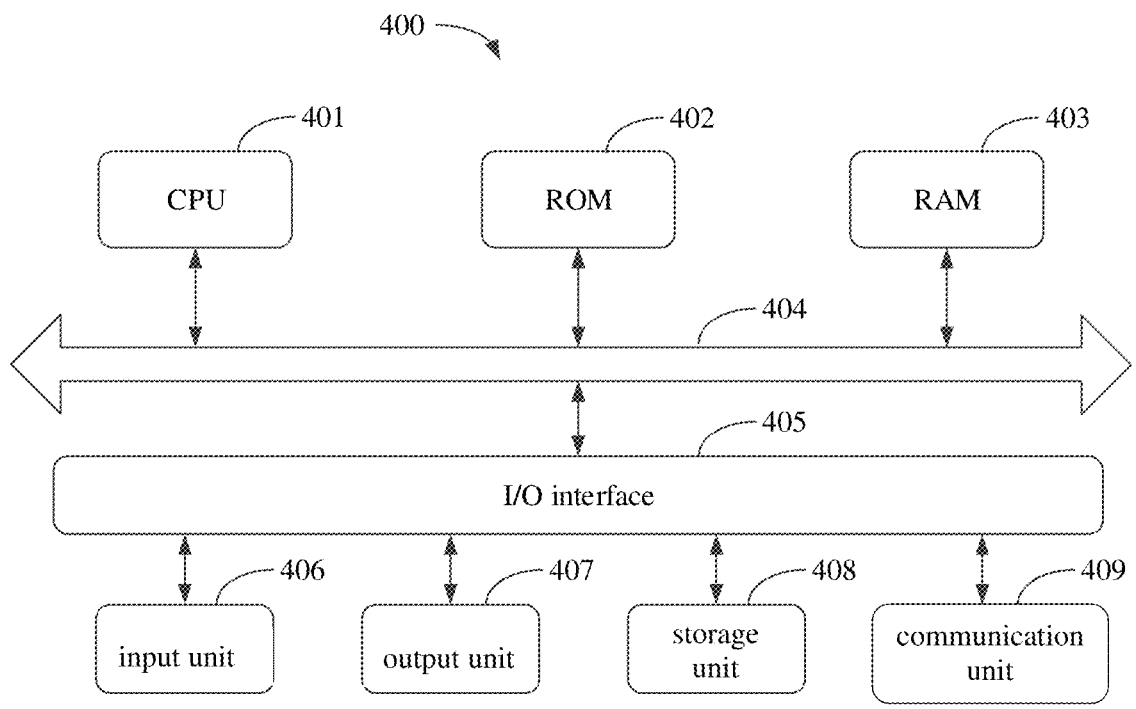
FIG. 4 illustrates a structural schematic diagram of a terminal device or a server according to an embodiment in the present application.

FIG. 4 illustrates a schematic diagram of an electronic device 400 for implementing the embodiment in the present application. The electronic device 400 includes a center processing unit (CPU) 401, which could execute each appropriate action and process according to the computer program instruction stored in a read-only memory (ROM) 402 or loaded on a random-access memory (RAM) 403 from a storage unit 408. The RAM 403 could store various program and data required by the electronic device 400. CPU 401, ROM 402 and RAM 403 are connected with each other by a bus 404. An input/output (I/O) interface 405 is also connected to the bus 404.

A plurality of components of the electronic device 400 are connected to the I/O interface 405. The components include an input unit 406, such as a keyboard, and a mouse, an output unit 407, such as various types of monitors and speakers, a storage unit 408, such as a disk and an optical disk, and a communication unit 409, such as an internet card, a modem and a wireless communication transceiver. The communication unit 409 allows the electronic device 400 exchanging information/data with other devices through computer networks such as the Internet and/or various telecommunication networks.

The CPU 401 executes the various methods and processes described above. In some embodiments, a part or all of the computer programs may be loaded or installed in the electronic device 400 through the ROM 402 and/or communication unit 409. When the computer program is loaded on the RAM 403 and is executed by the CPU 401, one or more steps of the above-mentioned method 200 could be executed. Optionally, in some other embodiments, the CPU 401 could be configured to execute the method 200 in any other proper manner (for example, by using firmware).

At least one part of the above-mentioned function in the disclosure can be executed by one or more hardware logic components. For example, the hardware logic component is not limited to the examples that may be used, which includes the field programmable gate array (FPGA), the application special integrated circuit (ASIC), the application special standard parts (ASSP), the system on chip (SOC), and the complex programmable logic device (CPLD).

The program code configured to implementing the method in the disclosure can adopt one or more programming language to be written. The program code may be provided to the general computer, the dedicated computer or the processor or controller of other programmable data processing devices, so that when the program code is executed by the processor or the controller, the functions/operations specified in the flow chat/block diagram is implemented. The program code may be completely or partly executed in the machine, or serves as an independent software package, which is partly executed in the machine, partly executed in the remote machine, or completely executed in the remote machine or server.

In the context of the disclosure, the machine-readable media could be the tangible media, which includes or stores the programs, which are used by the command execution system, device or equipment or used in combination by command execution system, device or equipment. The machine-readable media could be a machine-readable signal media or a machine-readable storage media. The machine-readable media could include but is not limited to the electronic, magnetic, optical, electromagnetic, infrared, or semiconductor systems, devices, or equipment, or any suitable combination of the above. The more detailed examples of the machine-readable storage media may include the electrical connection based on one or more wires, portable computer disk, hard disk, random access memory (RAM), read-only memory (ROM), erasable programmable read-only memory (EPROM or flash memory), optical fiber, portable compact disc read-only memory (CD-ROM), optical storage device, magnetic storage device, or any suitable combination of the above.

In addition, although the various operations are described in a specific sequence, it should be so understood that the operations should be performed in the described specific sequence or in a sequential order, or all illustrated operations should be performed to obtain the desired results. Under certain circumstances, multitasking and parallel processing may be beneficial. Although the above description includes several specific implementation details, these should not be interpreted as limiting the scope of the disclosure. A certain of features described in the context in the separate embodiments may also be implemented in combination in one embodiment. On the contrary, various features described in the context in a single embodiment could also be implemented in multiple embodiments individually or in any suitable sub combination.

Although the subject matter of the present application is described in terms specific to the structural features and/or method logic actions, it should be understood that the subject matter defined in the appended claims is not necessarily limited to the specific features or actions described above. On the contrary, the specific features and actions described above are only embodiments for realizing the claims.

What is claimed is:

1. A cooling system for data center based on hyperbola cooling tower, comprising: a compressor, a condenser, a primary fluorine pump, a secondary fluorine pump, a throttling apparatus, an evaporator, and a server; wherein,
    the server is configured to receive data information uploaded from the compressor, the condenser, the primary fluorine pump, the secondary fluorine pump, the throttling apparatus, and the evaporator, generate an operation curve of at least one of the compressor, the condenser, the primary fluorine pump, the secondary fluorine pump, the throttling apparatus, or the evaporator based on the data information, determine an operation frequency of the compressor based on the operation curve and a refrigerant transportation amount required for each area of the data center, and control the condenser, the primary fluorine pump, the secondary fluorine pump, and the throttling apparatus to transport a refrigerant to the evaporator;
    the condenser is configured to cool the refrigerant transported from the compressor and transport the refrigerant to the primary fluorine pump;
    the primary fluorine pump is configured to receive the refrigerant transported from the condenser and transport the refrigerant to the secondary fluorine pump;
    the secondary fluorine pump is configured to receive the refrigerant transported from the primary fluorine pump and transport the refrigerant to the evaporator via the throttling apparatus;
    the throttling apparatus is configured to control a flow rate of the refrigerant transported to the evaporator; and
    the evaporator is configured to release the refrigerant.

2. The cooling system according to claim 1, wherein the server is further configured to:
    determine a total refrigerant transportation amount based on the refrigerant transportation amount required for each area of the data center;
    determine time required for refrigerating in each area based on the operation curve; and
    determine the operation frequency of the compressor based on the total refrigerant transportation amount and the time required for refrigerating in each area.

3. The cooling system according to claim 2, wherein the cooling system further comprises a plurality of sensors,
    the plurality of sensors are configured to acquire a system temperature, a system flow rate, an outdoor temperature, an outdoor humidity, and temperatures and humidity of each area of the data center; and
    wherein, the server is further configured to determine the total refrigerant transportation amount required for each area of the data center based on the system temperature, the system flow rate, the outdoor temperature, the outdoor humidity, and the temperatures and humidity of each area of the data center.

4. The cooling system according to claim 3, wherein each area of the data center comprises one or more cooling areas; and the plurality of sensors comprise an area temperature sensor, which is configured to:
    acquire a temperature value in each of the one or more cooling areas, and upload the temperature value to the server; and
    wherein the server is further configured to receive the temperature value and adjust a refrigerant amount transported to the one or more cooling areas based on the temperature value.

5. The cooling system according to claim 4, wherein the server is further configured to:
    adjust the refrigerant amount transported to the one or more cooling areas based on a predetermined proportional—integral—derivative (PID) logic.

6. The cooling system according to claim 5, wherein the plurality of sensors further comprise a compressor sensor, which is configured to:
    monitor an operation state of the compressor, and upload a monitoring data to the server; and
    wherein the server is further configured to receive the monitoring data and adjust a frequency, a flow rate, and at least one of an evaporation temperature or a condensation temperature of the compressor based on the monitoring data.

7. The cooling system according to claim 6, wherein the compressor sensor is further configured to:
    monitor an inlet pressure, an outlet pressure and an inlet flow rate of the compressor.

8. The cooling system according to claim 7, wherein the secondary fluorine pump is configured to transport refrigerant to one or more evaporators, and the primary fluorine pump is configured to transport refrigerant to one or more secondary fluorine pumps.

9. The cooling system according to claim 8, wherein the plurality of sensors further comprise an outdoor environment temperature sensor, which is configured to:

acquire environment temperatures around each area of the data center, and upload the environment temperatures to the server; and wherein the server is further configured to receive the environment temperatures around each area of the data center; and, when any one of the environment temperatures is lower than a threshold value, stop refrigerant transportation to a corresponding area.

* * * * *